United States Patent
Miura et al.

(10) Patent No.: US 10,254,774 B2
(45) Date of Patent: Apr. 9, 2019

(54) TEMPERATURE CONTROL METHOD, CONTROL APPARATUS, AND PLASMA PROCESSING APPARATUS

(71) Applicant: Tokyo Electron Limited, Tokyo (JP)

(72) Inventors: Tatsuya Miura, Miyagi (JP); Wataru Ozawa, Miyagi (JP); Kimihiro Fukasawa, Miyagi (JP); Kazunori Kazama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 917 days.

(21) Appl. No.: 14/354,649

(22) PCT Filed: Oct. 30, 2012

(86) PCT No.: PCT/JP2012/078077
§ 371 (c)(1),
(2) Date: Apr. 28, 2014

(87) PCT Pub. No.: WO2013/069510
PCT Pub. Date: May 16, 2013

(65) Prior Publication Data
US 2014/0288726 A1  Sep. 25, 2014

Related U.S. Application Data

(60) Provisional application No. 61/560,952, filed on Nov. 17, 2011.

(30) Foreign Application Priority Data

Nov. 8, 2011  (JP) ................................. 2011-244539

(51) Int. Cl.
*G05D 23/00* (2006.01)
*G05D 23/19* (2006.01)
(Continued)

(52) U.S. Cl.
CPC ......... *G05D 23/19* (2013.01); *G05D 23/1904* (2013.01); *H01J 37/32522* (2013.01); *H01L 21/67248* (2013.01); *H01L 21/6831* (2013.01)

(58) Field of Classification Search
CPC ....................................................... G05D 23/19
(Continued)

(56) References Cited

U.S. PATENT DOCUMENTS 5,089,441 A * 2/1992 Moslehi ............ H01L 21/02046
134/1
5,589,041 A * 12/1996 Lantsman ......... H01J 37/32522
204/192.33

(Continued)

FOREIGN PATENT DOCUMENTS

JP   08-158071   6/1996
JP   09-260474   10/1997
(Continued)

*Primary Examiner* — Evral E Bodden
(74) *Attorney, Agent, or Firm* — IPUSA, PLLC

(57) ABSTRACT

A temperature control method is provided for controlling a plasma processing apparatus that is capable of changing a temperature setting for each step of a plasma process including multiple steps. The method includes a transfer step of performing an entry process for transferring a workpiece into a processing chamber of the plasma processing apparatus and/or an exit process for transferring the workpiece out of the processing chamber, a process execution step of executing the plasma process including multiple steps, and a temperature control step of performing a first temperature control and/or a second temperature control. The first temperature control includes controlling a temperature to a temperature setting of a next process according to a time execution of the plasma process is completed, and the second temperature control includes controlling the tem- (Continued)

perature to the temperature setting of the next process in parallel with the entry process and/or the exit process.

14 Claims, 7 Drawing Sheets

(51) Int. Cl.
    *H01L 21/67*     (2006.01)
    *H01L 21/683*     (2006.01)
    *H01J 37/32*     (2006.01)

(58) Field of Classification Search
    USPC .......................................................... 700/299
    See application file for complete search history.

(56) References Cited

U.S. PATENT DOCUMENTS

| | | | | |
|---|---|---|---|---|
| 5,956,837 | A * | 9/1999 | Shiota | B25B 11/002 269/8 |
| 6,921,724 | B2 * | 7/2005 | Kamp | H01L 21/31116 156/345.52 |
| 6,975,497 | B2 * | 12/2005 | Nagao | G03F 7/70691 279/128 |
| 8,194,384 | B2 * | 6/2012 | Nasman | H02N 13/00 361/234 |
| 8,273,670 | B1 * | 9/2012 | Rivkin | H01L 21/67103 118/640 |
| 8,866,389 | B2 * | 10/2014 | Okino | H05H 1/0006 118/726 |
| 2002/0107660 | A1 * | 8/2002 | Nikoonahad | G01N 21/211 702/155 |
| 2007/0024167 | A1 * | 2/2007 | Kim | H05K 7/20963 313/46 |
| 2016/0079106 | A1 * | 3/2016 | Takeuchi | H01L 21/67248 361/234 |

FOREIGN PATENT DOCUMENTS

| | | |
|---|---|---|
| JP | 11-345771 | 12/1999 |
| JP | 2010-506381 | 2/2010 |
| KR | 10-2009-0122163 | 11/2009 |
| WO | WO 2008/039611 | 4/2008 |

* cited by examiner

TEMPERATURE CONTROL METHOD, CONTROL APPARATUS, AND PLASMA PROCESSING APPARATUS

CROSS-REFERENCE TO RELATED APPLICATIONS

The present application is a National Stage of International Application No. PCT/JP2012/078077 filed on Oct. 30, 2012, claiming priority based on Japanese Patent Application No. 2011-244539 filed on Nov. 8, 2011, and U.S. Provisional Application No. 61/560,952 filed on Nov. 17, 2011, the entire contents of which are hereby incorporated by reference.

TECHNICAL FIELD

The present invention relates to a temperature control method, a control apparatus, and a plasma processing apparatus.

BACKGROUND ART

Recent temperature control techniques implemented in a plasma process including multiple steps for processing a workpiece such as a wafer or a substrate enable a temperature setting to be changed with respect to each step. For example, Patent Document 1 discloses a temperature control technique that involves embedding a heater within an electrostatic chuck (ESC) so that the surface temperature of the electrostatic chuck may be rapidly changed through heat generation by the heater.

PRIOR ART DOCUMENTS

Patent Documents

Patent Document 1: Japanese Laid-Open Patent Publication No. 2010-506381

SUMMARY OF THE INVENTION

Problem to be Solved by the Invention

However, in the case of successively processing product wafers by performing a plasma process including multiple steps on each product wafer, there may be a substantial temperature difference between a temperature setting of the last step of a first process and a temperature setting of the first step of a second process. In such a case, after the first process is completed and the temperature is controlled to the temperature setting of the second process, a relatively long temperature stabilization wait time may ensue before the temperature reaches the desired temperature setting, and as a result, the operating rate of the plasma processing apparatus may be degraded.

In light of the above, one aspect of the present invention relates to providing a temperature control method, a control apparatus, and a plasma processing apparatus that are capable of reducing the temperature stabilization wait time by adjusting temperature setting control in a plasma process including multiple steps for processing a workpiece.

Means for Solving the Problem

According to one embodiment of the present invention, a temperature control method is provided for controlling a plasma processing apparatus that performs a plasma process including a plurality of steps on a workpiece and is capable of changing a temperature setting for each step of the plasma process. The temperature control method includes a transfer step of performing at least one of an entry process for transferring the workpiece into a processing chamber of the plasma processing apparatus and an exit process for transferring the workpiece out of the processing chamber, a process execution step of executing the plasma process including the plurality of steps, and a temperature control step of performing at least one of a first temperature control and a second temperature control. The first temperature control includes controlling a temperature to a temperature setting of a next process according to a time the execution of the plasma process is completed, and the second temperature control includes controlling the temperature to the temperature setting of the next process in parallel with at least one of the entry process and the exit process.

According to another embodiment of the present invention, a control apparatus is provided that is used in a plasma processing apparatus that performs a plasma process including a plurality of steps on a workpiece and is capable of changing a temperature setting for each step of the plasma process. The control apparatus includes a transfer control unit that performs at least one of an entry process for transferring the workpiece into a processing chamber of the plasma processing apparatus and an exit process for transferring the workpiece out of the processing chamber, a process execution unit that executes the plasma process including the plurality of steps, and a temperature control unit that performs at least one of a first temperature control and a second temperature control. The first temperature control includes controlling a temperature to a temperature setting of a next process according to a time the execution of the plasma process is completed, and the second temperature control includes controlling the temperature to the temperature setting of the next process in parallel with at least one of the entry process and the exit process.

According to another embodiment of the present invention, a plasma processing apparatus is provided that includes a processing chamber; a gas supply source that supplies gas to the processing chamber; a plasma source that supplies power for plasma generation to the processing chamber and generates plasma from gas within the processing chamber; a temperature control unit that controls a temperature of at least one of a mounting table in the processing chamber, an upper electrode in the processing chamber, a deposition shield in the processing chamber, and the processing chamber; a transfer control unit that performs at least one of an entry process for transferring a workpiece into the processing chamber and an exit process for transferring the workpiece out of the processing chamber; and a process execution unit that executes a plasma process including a plurality of steps using the generated plasma. The temperature control unit performs at least one of a first temperature control and a second temperature control. The first temperature control includes controlling the temperature to a temperature setting of a next process according to a time the execution of the plasma process is completed, and the second temperature control includes controlling the temperature to the temperature setting of the next process in parallel with at least one of the entry process and the exit process.

Advantageous Effect of the Invention

According to an aspect of the present invention, by adjusting temperature setting control in a plasma process including multiple steps for processing a workpiece, the temperature stabilization wait time may be reduced.

EMBODIMENTS FOR IMPLEMENTING THE INVENTION

Figure 1:
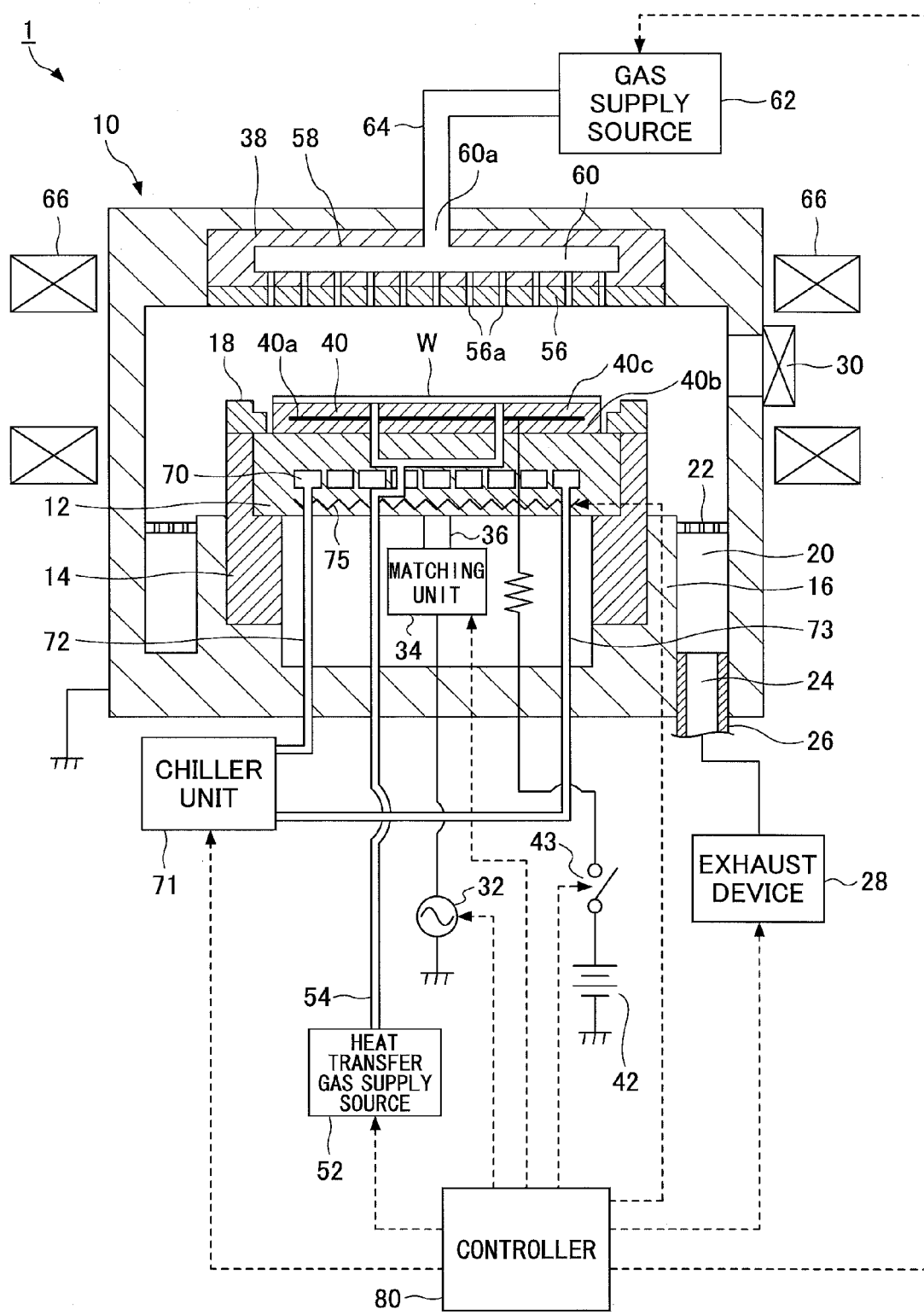
FIG. 1 illustrates an overall configuration of a plasma processing apparatus according to an embodiment of the present invention.

In the following, embodiments of the present invention are described with reference to the accompanying drawings. Note that elements having substantially the same functions or features may be given the same reference numerals and overlapping descriptions thereof may be omitted.

Introduction

Recent plasma processing apparatuses have mechanisms for enabling a temperature setting to be changed with respect to each step in a plasma process including multiple steps for processing a wafer. For example, a mechanism that uses a heater to rapidly adjust the surface temperature of an electrostatic chuck (ESC) may be implemented as a high-speed temperature control technique for rapidly controlling the temperature of the electrostatic chuck in each process or in each step.

Note that during a plasma process for etching a wafer, by-products generated as a result of etching a multilayer resist film and a metal-containing mask formed on a wafer may adhere to the surface of an electrostatic chuck. When such by-products are deposited on the surface of the electrostatic chuck, the state of the electrostatic chuck surface may change, and the electrostatic attraction force of the electrostatic chuck for attracting the wafer thereto may be degraded. Accordingly, in a case where a plasma process is successively performed on multiple product wafers, a cleaning process for cleaning the surface of the electrostatic chuck may be performed in between the plasma processes to remove the by-products adhered to the surface of the electrostatic chuck.

Upon performing such cleaning process, the by-products adhered to the surface of the electrostatic chuck may be more effectively removed by controlling the temperature of the electrostatic chuck to a high temperature using a high-speed temperature control mechanism including the above heater.

However, when the temperature setting of such a cleaning process is set to a high temperature, a substantial difference may be created between the temperature setting of the cleaning process and the temperature settings of the steps of the wafer process. In turn, a temperature stabilization wait time may be imposed upon raising or lowering the temperature to the desired temperature setting. As a result, the operating rate of the plasma processing apparatus may decrease and throughput may be degraded.

Figure 3:
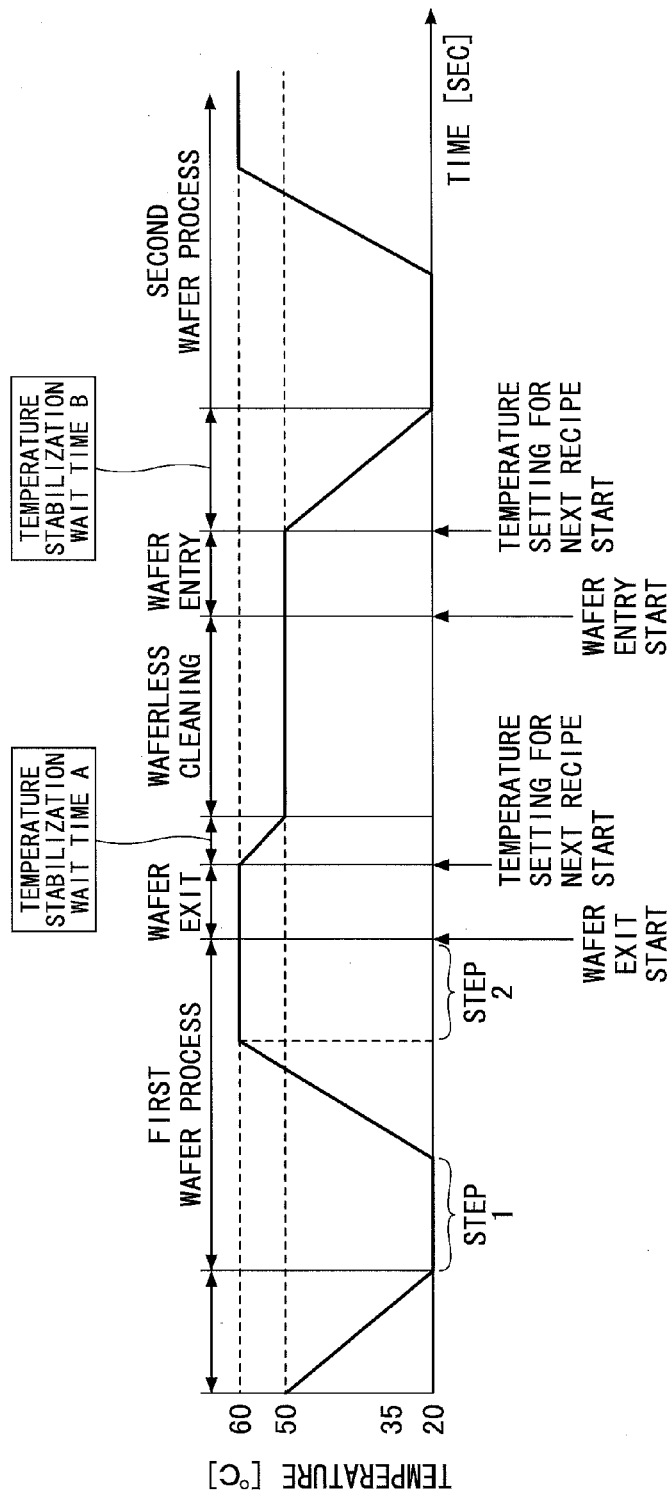
FIG. 3 illustrates a general example of temperature control.

For example, FIG. 3 illustrates a general example of temperature control based on temperature settings set up for each step of a plasma etching process. FIG. 3 illustrates an exemplary case of implementing temperature control in a plasma etching process including two steps for processing a wafer, the plasma process being performed by a plasma processing apparatus that is capable of changing the temperature setting for each step. As illustrated in the table at the upper side of FIG. 3, an etching process recipe has temperature settings during entry and exit of a product wafer and temperature settings of step 1 and step 2 of the etching process set up beforehand. Also, a cleaning (WLDC: waferless dry cleaning) recipe has temperature settings during entry and exit of a product wafer and a temperature setting during the cleaning process set up beforehand. Note that waferless cleaning refers to a process of executing the plasma process without having a wafer placed inside the processing chamber for the purpose of cleaning the surface of the ESC. Thus, a wafer does not actually enter or exit the processing chamber during the cleaning process. However, the cleaning recipe of the present example has temperature settings for wafer entry/exit as a matter of convenience. Note that each recipe describes execution procedures for executing a corresponding process and temperature settings during execution of the process. In the present example, the temperature setting during wafer entry and the temperature setting during wafer exit are the same within each recipe.

In this case, as illustrated by the graph at the lower side of FIG. 3, before an etching process for a first wafer is started, the temperature is controlled to the temperature setting 20° C., of step 1, and a temperature stabilization wait time is imposed as a result. After the temperature is stabilized, step 1 of the etching process is executed, and the temperature is then controlled to the temperature setting 60° C. of step 2. A temperature stabilization wait time is once again imposed at this point, and after the temperature stabilization wait time elapses, step 2 of the etching process is executed.

After step 2 is completed, the first wafer is discharged (wafer exit process). After the wafer exit process is completed, the temperature is controlled to the temperature setting 50° C. of the wafer entry process prescribed in the cleaning (WLDC) recipe describing the execution procedures for executing the next process. A temperature stabilization wait time is once again imposed at this point (temperature stabilization wait A). After temperature stabilization, the cleaning process is executed. Note that the deposited by-products generated during the etching process may be effectively removed by setting the temperature during the cleaning process to a high temperature. Accordingly, in the present example, the temperature setting of the cleaning process is set to 50° C., which is higher than the setting temperature 20° C. set up for step 1 of the etching process.

In the present example, when the process is switched from the etching process to the cleaning process, the temperature setting is changed from 60° C. to 50° C. When the process is switched from the cleaning process to the etching process, the temperature setting is changed from 50° C. to 20° C. Note that a temperature stabilization wait time is imposed each time the temperature setting is changed. Also, the temperature stabilization wait time becomes longer as the temperature difference between the temperature settings increases.

The temperature stabilization wait time is represented by diagonal lines in the graph of FIG. 3. When there is a difference between temperature settings of processes to be executed one after another for various reasons such as the desirability of a high temperature setting during the cleaning process, a temperature stabilization wait time may be frequently imposed before a process may be executed. As a result, throughput may be degraded and productivity may decrease.

In embodiments of the present invention described below, temperature setting control is adjusted to reduce the temperature stabilization wait times A and B of the temperature stabilization wait times represented by diagonal lines in FIG. 3.

[Overall Configuration of Plasma Processing Apparatus]

First, an overall configuration of a plasma processing apparatus that performs a temperature control method according to an embodiment of the present invention is described with reference to FIG. 1.

The plasma processing apparatus 1 illustrated in FIG. 1 is an example of a plasma processing apparatus that is capable of changing a temperature setting for each step upon executing a plasma process including multiple steps for processing a workpiece. The plasma processing apparatus 1 is configured as a RIE (Reactive Ion Etching) plasma processing apparatus. The plasma processing apparatus 1 includes a cylindrical chamber (processing chamber 10) made of a metal such as aluminum or stainless steel, for example. The processing chamber 10 is grounded. Within the processing chamber 10, a plasma process such as an etching process is performed on a workpiece.

A mounting table 12 configured to have a semiconductor wafer W (hereinafter, simply referred to as a "wafer W") mounted thereon as a workpiece to be processed is arranged within the processing chamber 10. In such a state, microfabrication processes such as etching may be performed on the wafer W using the action of plasma. The mounting table 12 may be made of aluminum, for example, and is supported on a cylindrical support 16 via an insulating cylindrical holder 14. The cylindrical support 16 extends vertically upward from a bottom of the processing chamber 10. A focus ring 18 that may be made of quartz, for example, is disposed on a top surface of the cylindrical holder 14 to surround a top surface edge of the mounting table 12.

An exhaust path 20 is formed between a sidewall of the processing chamber 10 and the cylindrical support 16. A ring-shaped baffle plate 22 is arranged in the exhaust path 20. An exhaust port 24 is formed at a bottom portion of the exhaust path 20 and is connected to an exhaust device 28 via an exhaust line 26. The exhaust device 28 includes a vacuum pump (not shown) and is configured to depressurize a processing space within the processing chamber 10 to a predetermined vacuum level. A gate valve 30 configured to open/close an entry/exit port for the wafer W is provided at the sidewall of the processing chamber 10.

A high frequency power supply 32 for plasma generation is electrically connected to the mounting table 12 via a matching unit 34 and a power feed rod 36. The high frequency power supply 32 is configured to apply a high frequency power of 60 MHz, for example, to the mounting table 12. In this way, the mounting table also acts as a lower electrode. Further, a shower head 38, which is described below, is provided at a ceiling portion of the processing chamber 10. The shower head 38 acts as an upper electrode of a ground potential. In this way, a high frequency voltage from the high frequency power supply 32 is capacitatively applied between the mounting table 12 and the shower head 38. The high frequency power supply 32 is an example of a plasma source that supplies power for plasma generation to the processing chamber 10 and generates plasma from gas within the processing chamber 10.

An electrostatic chuck 40 configured to hold the wafer W by an electrostatic attractive force is provided on the top surface of the mounting table 12. The electrostatic chuck 40 includes an electrode 40a that is made of a conductive film and is arranged between a pair of insulating films 40b and 40c. A DC power supply 42 is electrically connected to the electrode 40a via a switch 43. The electrostatic chuck 40 electrostatically attracts and holds the wafer W thereon by a Coulomb force generated by a DC voltage from the DC power supply 42.

A heat transfer gas supply source 52 is configured to supply a heat transfer gas such as He gas between a top surface of the electrostatic chuck 40 and a rear surface of the wafer W through a gas supply line 54. The shower head 38 disposed at the ceiling portion of the processing chamber 10 includes an electrode plate 56 having multiple gas holes 56a and an electrode supporting body 58 configured to detachably hold the electrode plate 56. A buffer chamber 60 is formed within the electrode supporting body 58. A gas inlet 60a of the buffer chamber 60 is connected to a gas supply line 64, which is connected to a gas supply source 62. In this way, desired gas may be supplied to the processing chamber 10 from the gas supply source 62.

A magnet 66 is arranged to extend annularly or concentrically around the processing chamber 10. An RF electric field is formed in a plasma generating space between the shower head 38 and the mounting table 12 within the processing chamber 10 along a vertical direction by the high frequency power supply 32. Due to a high frequency discharge, high-density plasma may be generated in the vicinity of the mounting table 12.

A coolant path 70 is formed within the mounting table 12. A coolant cooled to a predetermined temperature is supplied to and circulated within the coolant path 70 from a chiller unit 71 via pipes 72 and 73. A heater 75 is embedded within the mounting table 12. A desired AC voltage is supplied to the heater 75 from a AC power supply (not shown). In this way, the processing temperature for processing the wafer W placed on the electrostatic chuck 40 may be adjusted to a desired temperature though cooling by the chiller unit 71 and heating by the heater 75. Such temperature control may be executed according to instructions from a controller 80 corresponding to a control apparatus of the plasma processing apparatus 1. Note that in some embodiments, the electrostatic chuck 40 may be divided into two zones including a center region and an edge region, and the heater 75 may be individually arranged at each zone. In this way, temperature control may be implemented with respect to each zone and temperature control accuracy may be improved further.

The controller 80 is configured to control the individual components of the plasma processing apparatus 1 such as the exhaust device 28, the high frequency power supply 32, the switch 43 for the electrostatic chuck 40, the matching unit 34, the heat transfer gas supply source 52, the gas supply source 62, the chiller unit 71, the heater within the electrostatic chuck 40 and the heater 75 within the electrostatic chuck 40. The controller 80 may also be connected to a host computer (not shown), for example.

Figure 2:
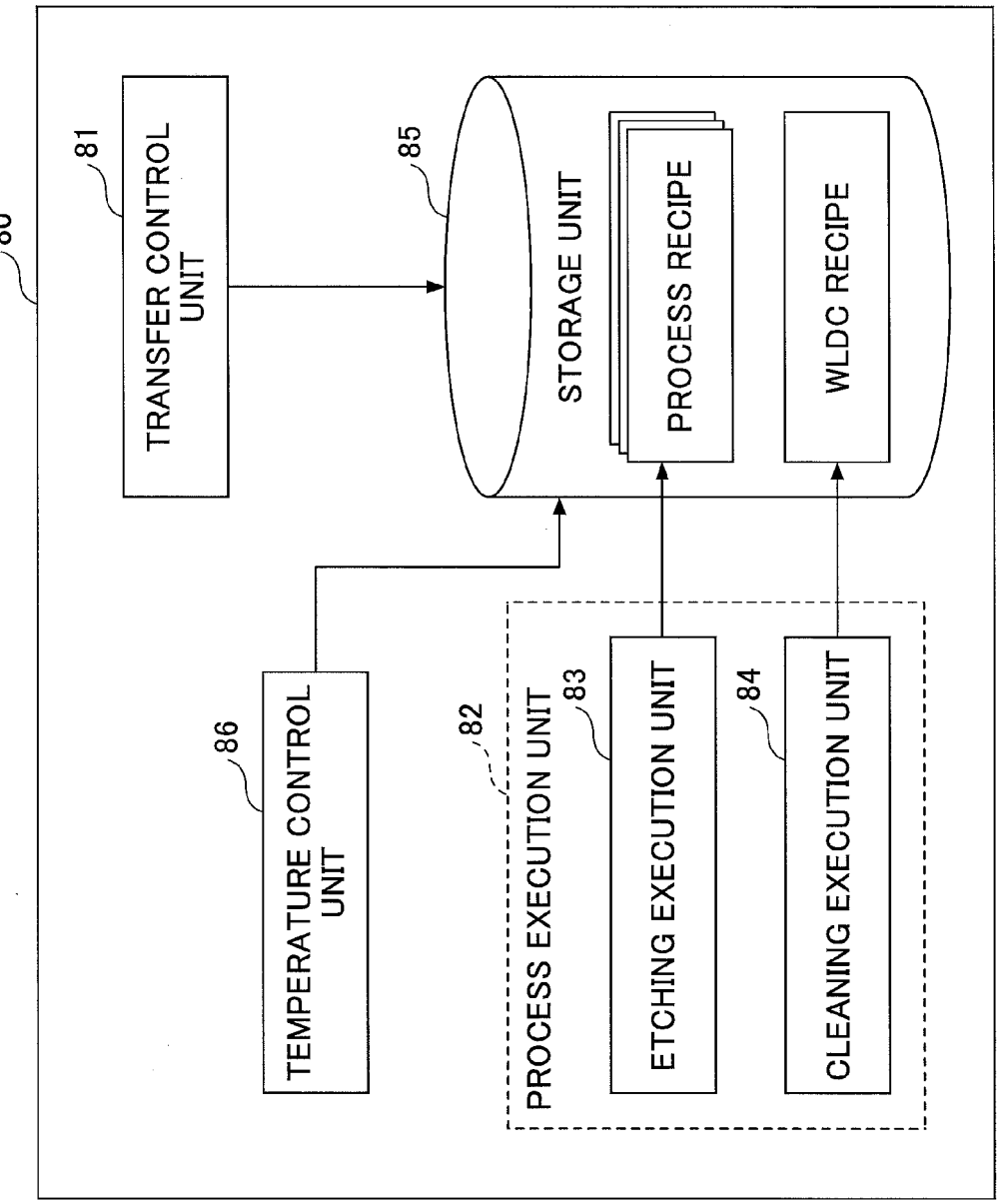
FIG. 2 illustrates a functional configuration of a controller according to an embodiment of the present invention.

The controller 80 has a CPU (Central Processing Unit), a ROM (Read Only Memory) and a RAM (Random Access Memory), which are not shown. The CPU executes processes according to various recipes stored in a storage unit 85 as illustrated in FIG. 2, for example. The recipes include apparatus control information according to processing conditions of multiple steps of a process, such as processing time, temperatures within the processing chamber (upper electrode temperature, side wall temperature of the processing chamber, lower electrode temperature, etc.), pressure, high frequency power to be applied, and flow rates of various processing gases, for example. Note that recipes described below primarily relate to temperature control. The storage unit 85 storing the recipes may be configured as the ROM or the RAM using a semiconductor memory, a magnetic disk, or an optical disk, for example. The recipes may be stored in a storage medium and loaded in the storage unit 85 via a driver (not shown), for example. Alternatively, the recipes may be downloaded from a network (not shown) and stored in the storage unit 85. Also, in some embodiments, a DSP (Digital Signal Processor) may be used instead of the CPU to implement the above-described functions of various components of the plasma processing apparatus 1. Note that functions of the controller 80 may be implemented by software or hardware.

When performing an etching process using the plasma processing apparatus 1 having the above-described configuration, first, the gate valve 30 is opened, and the wafer W is loaded into the processing chamber 10 while being held by a transfer arm. Then, the wafer W is lifted from the transfer arm by pusher pins (not shown) protruding from the surface of the electrostatic chuck 40, and the wafer W is held on the pusher pins. Subsequently, after the transfer arm exits the processing chamber 10, the pusher pins are lowered into the electrostatic chuck 40 so that the wafer W may be placed on the electrostatic chuck 40.

After the wafer W is loaded, the gate valve 30 is closed. Then, an etching gas is introduced into the processing chamber 10 from the gas supply source 62 at a predetermined flow rate and a predetermined flow rate ratio, and the internal pressure of the processing chamber 10 is reduced to a predetermined pressure by the exhaust device 28. Further, a high frequency power of a certain power level is applied to the mounting table 12 from the high frequency power supply 32. Also, a DC voltage from the DC power supply 42 is applied to the electrode 40a of the electrostatic chuck 40 so that the wafer W may be firmly fixed to the electrostatic chuck 40. The etching gas sprayed into the processing chamber 10 from the shower head 38 is excited into plasma by the high frequency power from the high frequency power supply 32. As a result, plasma is generated within a plasma generating space between the upper electrode (shower head 38) and the lower electrode (mounting table 12). A main surface of the wafer W is etched by radicals and ions contained in the generated plasma.

After plasma etching is completed, the wafer W is lifted by and held on the pusher pins. After the gate valve 30 is opened and the transfer arm is introduced into the processing chamber 10, the pusher pins are lowered and the wafer W is held on the transfer arm. Subsequently, the transfer arm exits the processing chamber 10, and a next wafer W is loaded into the processing chamber 10 by the transfer arm. By repeating the above-described process, wafers W may be successively processed.

An exemplary plasma processing apparatus capable of implementing a temperature control method according to an embodiment of the present invention has been described above. In the following, a functional configuration of the controller 80 as an example of a control apparatus that executes the temperature control method of the present embodiment is described with reference to FIG. 2.

[Configuration of Controller]

FIG. 2 illustrates a functional configuration of the controller 80. The controller 80 includes a transfer control unit 81, a process execution unit 82, the storage unit 85, and a temperature control unit 86.

The transfer control unit 81 controls a wafer entry process for transferring (loading) the wafer into the processing chamber 10 of the plasma processing apparatus 1 and a wafer exit process for transferring (unloading) the wafer out of the processing chamber 10. Note that the wafer entry process includes the procedures of opening the gate valve 30 of the processing chamber 10, transferring the wafer W that is held by the transfer arm into the processing chamber 10 via the gate valve 30, lifting the wafer W from the transfer arm using the pusher pins protruding from the surface of the electrostatic chuck 40, arranging the pusher pins to hold the wafer W while the transfer arm exits the processing chamber 10, and lowering the pusher pins into the electrostatic chuck 40 after the transfer arm exits the processing chamber 10 so that the wafer W is placed on the electrostatic chuck 40. The wafer exit process includes the procedures of lifting the wafer W and arranging the pusher pins to hold the wafer W after plasma etching is completed, opening the gate valve 30 to have the transfer arm enter the processing chamber 10, lowering the pusher pins so that the wafer W is held by the transfer arm, and arranging the transfer arm to exit the processing chamber 10.

The storage unit 85 stores a plurality of recipes for executing an etching process, and a WLDC recipe for executing a waferless cleaning process, for example.

The process execution unit 82 includes an etching execution unit 83 and a cleaning execution unit 84. The etching execution unit 83 executes a plasma etching process including multiple steps. The etching execution unit 83 selects a desired recipe from the plurality of recipes stored in the storage unit 85 and executes an etching process according to the selected recipe. The cleaning execution unit 84 executes a cleaning process according to the WLDC recipe stored in the storage unit 85.

The temperature control unit 86 controls the temperature of the electrostatic chuck 40 arranged within the processing chamber 10. The temperature control unit 86 executes at least one of a first temperature control for controlling the temperature to the temperature setting of a next process according to the time execution of an etching process is completed, and a second temperature control for controlling the temperature to the setting temperature of a next process in parallel with a wafer entry process or a wafer exit process.

In the following, operations including the first temperature control and the second temperature control executed by the controller 80 using the above functional components are described.

[Controller Operations]

Figure 4:
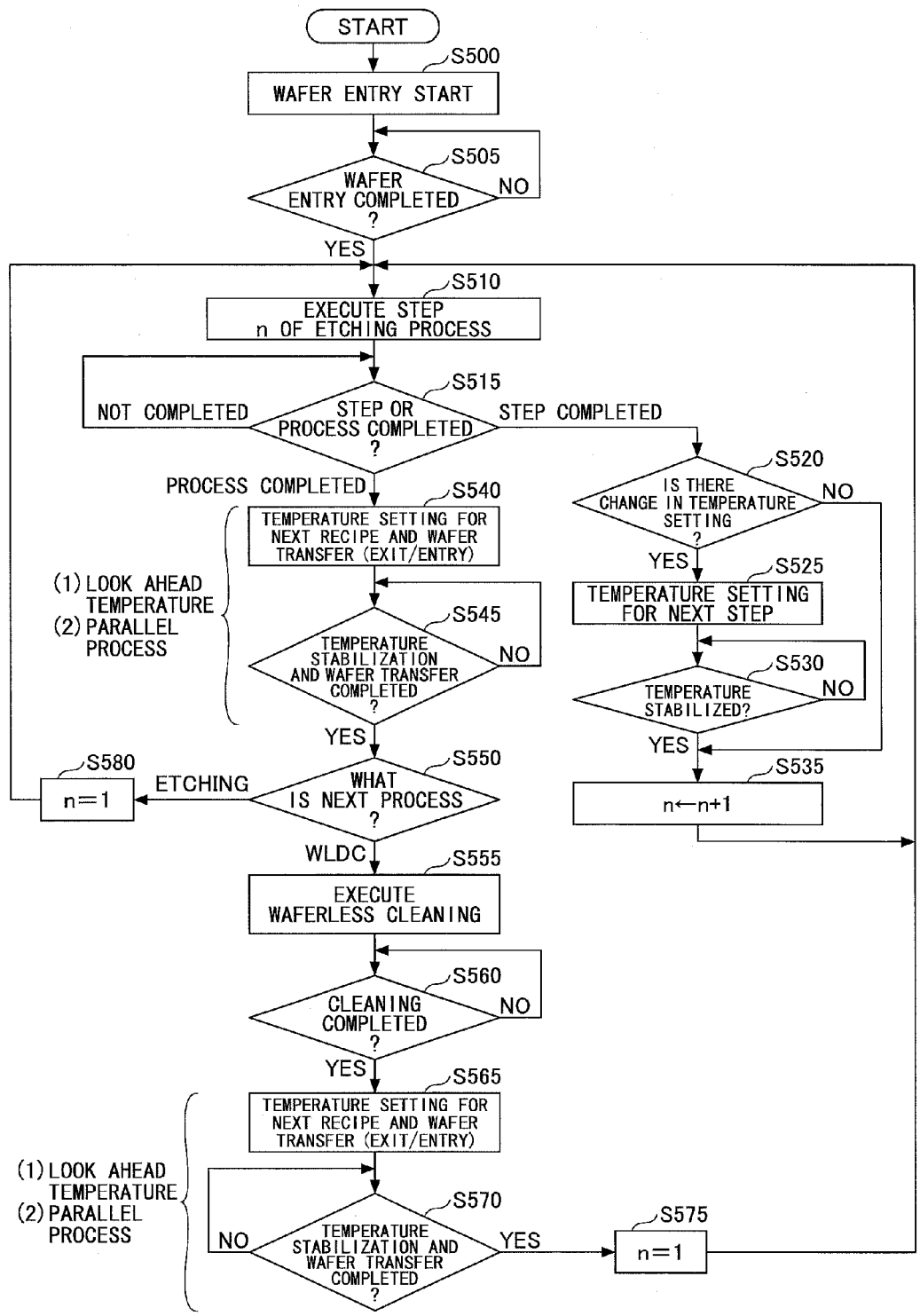
FIG. 4 is a flowchart illustrating process steps of temperature control according to an embodiment of the present invention.

FIG. 4 is a flowchart illustrating process steps of a temperature control process for controlling the temperature of the electrostatic chuck 40 (wafer W) using the controller 80 according to an embodiment of the present invention. Note that before the present temperature control process is started, a variable n indicating the step number is set equal to the default value "1". Also, before the present temperature control process is started, the temperature within the processing chamber 10 is adjusted to the temperature setting 20° C. of the wafer entry process prescribed in the etching process recipe illustrated in the table of FIG. 5.

When the present temperature control process is started, first, the transfer control unit 81 starts the wafer entry process of the wafer W (step S500). Then, the transfer control unit 81 determines whether the wafer W has been transferred into the processing chamber 10 via the gate valve 30 (step S505). If the wafer W has been transferred into the processing chamber 10 via the gate valve 30, the etching execution unit 83 executes step 1 of an etching process on the wafer W (step S510). In this way, step 1 of the etching process is performed on a first wafer as illustrated by the graph at the lower side of FIG. 5.

Then, the etching execution unit 83 determines whether the present step or the process including the present step has been completed (step S515). If the present step has been completed, the temperature control unit 86 determines whether there is a change in the temperature setting in the next step of the etching process (step S520). If there is a change in the temperature setting, the temperature control unit 86 controls the temperature to the temperature setting of the next step (step S525), and waits (i.e., does not start the next step) until the temperature stabilizes to the temperature setting of the next step (step S530). After the temperature stabilizes to the desired temperature setting, the etching execution unit 83 increments the step number n by one (step S535) and returns to step S510 to execute step 2 of the etching process. In the graph illustrated at the lower side of FIG. 5, after step 1 of the etching process for the first wafer is executed, a temperature stabilization wait time is imposed until the temperature is raised to 60° C., and after the temperature reaches 60° C. and stabilizes at this temperature, step 2 of the etching process is executed.

On the other hand, if it is determined in step S515 that the present step has been completed and it is determined in step S520 that there is no change in the temperature setting in the next step of the process recipe, the temperature control process proceeds straight to step S535 where the etching execution unit 83 increments the step number n by one and returns to step S510 to execute step 2 of the etching process. In this way, the above process steps S510-S535 are repeated until the last step of the etching process is executed.

If it is determined that all the steps of a process have been completed, it is determined that the corresponding process has been completed, and the temperature control unit 86 controls the temperature to the temperature setting of the next recipe describing the execution procedures of the next process to be executed, and the transfer control unit 81 executes a wafer exit process (step S540). Note that in the present example, the next process corresponds to a WLDC process, and accordingly, a wafer entry process is not performed after the wafer exit process. Thus, as illustrated by the graph of FIG. 5, after step 2 of the etching process is completed, temperature control for controlling the temperature to the temperature setting of the next recipe is executed in parallel with the wafer exit process.

When temperature control for controlling the temperature to the temperature setting of the next recipe is executed after the wafer exit process, the temperature stabilization wait time may be prolonged. However, in the present embodiment, the temperature control unit 86 looks ahead at the temperature setting of the next recipe immediately after execution of the last step of the preceding process is completed, and controls the temperature to the temperature setting of the next recipe in parallel with the wafer exit process. In the graph of FIG. 5, the temperature control unit 86 controls the temperature to the temperature setting 50° C. of the wafer entry process prescribed in the cleaning recipe in parallel with the wafer exit process of the first wafer. In this way, the temperature stabilization wait time may be reduced.

When the temperature of the electrostatic chuck 40 stabilizes to the temperature setting of the next recipe and the wafer exit process is completed (step S545), the process execution unit 82 determines the next process to be executed (step S550), and executes the next process accordingly. In the present example, the next process corresponds to the waferless dry cleaning process. Thus, the cleaning execution unit 84 of the process execution unit 82 executes the waferless dry cleaning process (step S555).

Figure 5:
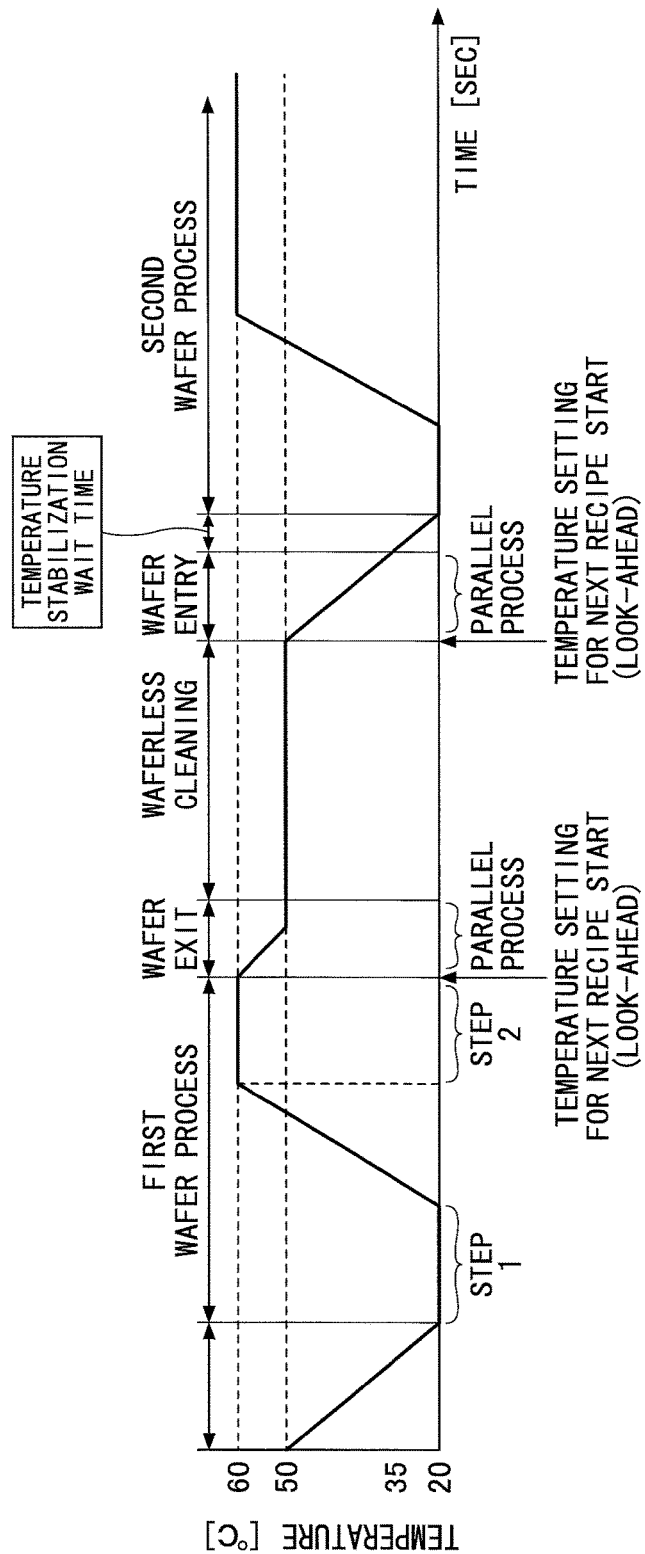
FIG. 5 illustrates an exemplary implementation of temperature control according to an embodiment of the present invention.

When it is determined in step S560 that the cleaning process has been completed, in step S565, the temperature control unit 86 controls the temperature to the temperature setting of the wafer exit process prescribed in the cleaning recipe (20° C. in the example of FIG. 5). That is, the temperature control unit 86 looks ahead at the temperature setting of the first step of the next recipe and controls the temperature to the temperature setting of the next recipe (look ahead temperature control). Such a temperature control is an example of the first temperature control. Also, in step S565, the transfer control unit 81 executes a wafer entry process in parallel with temperature control (parallel process of temperature control and transfer control). Such a parallel process is an example of the second temperature control. In the present example, because the preceding process is the waferless dry cleaning process, a wafer exit process is not executed and only a wafer entry process for loading a second wafer W is executed. Accordingly, temperature control for the next recipe (look ahead temperature control) and the wafer entry process may be executed in parallel, and in this way, the temperature stabilization wait time may be reduced.

When it is determined that the temperature of the electrostatic chuck 40 has reached the temperature setting of the next process (20° C. in the example of FIG. 5) and has stabilized at this temperature (step S570), the etching execution unit 83 of the process execution unit 82 sets the step number n equal to 1 (step S575) and returns to step S510 to execute step 1 of the etching process on the second wafer W.

Note that in the case where the process execution unit 82 determines in step S550 that the next process is an etching process, the etching execution unit 83 of the process execution unit 82 likewise sets the step number n equal to 1 (step S580) and returns to step S510 to execute step 1 of the etching process on the second wafer W.

Exemplary Advantages

By implementing the above-described control operations of the controller 80, the temperature stabilization wait time for stabilizing the temperature of the electrostatic chuck 40 of the plasma processing apparatus 1 may be reduced, and as a result, the temperature of a wafer W placed on the electrostatic chuck 40 may be rapidly adjusted to a desired temperature. By allowing different temperatures to be set up as the temperature setting during wafer entry and the temperature setting during wafer exit of a plasma process including multiple steps for processing a wafer W, and controlling the temperature during a cleaning process to be higher than the temperature during an etching process, reaction by-products deposited on the electrostatic chuck 40 may be effectively removed.

Also, by implementing look ahead temperature control by looking ahead at the temperature setting of a next recipe at the time a process is completed, the temperature stabilization wait time in the cleaning process may be reduced. Further, by executing a wafer entry process or a wafer exit process in parallel with the temperature stabilization wait process initiated by the look ahead temperature control, the temperature stabilization wait time before wafer entry or wafer exit may be reduced.

As can be appreciated by comparing the temperature changes in the general temperature control example illustrated in FIG. 3 and the temperature control example according to the present embodiment as illustrated in FIG. 5, when an etching process recipe (main recipe) and a cleaning recipe (WLDC recipe) have different temperature settings, the temperature stabilization wait time may be substantially reduced in a case where the temperature control method of the present embodiment is implemented compared to a case where the general temperature control method is implemented. As a result, throughput upon wafer processing may be improved, and productivity may be increased.

(Temperature Control Variations)

In the following, temperature control timing variations from the above temperature control are described. In the embodiment described above, the wafer exit process and temperature control for executing the cleaning process are started substantially at the same time when a wafer process is completed. Also, in the above embodiment, the wafer entry process and temperature control for executing an etching process on the second wafer W are started substantially at the same time.

However, temperature control of the present embodiment that involves looking ahead at the temperature setting of the next recipe at the time a process is completed is merely one example of the first temperature control for controlling the temperature setting of a next process according to the time execution of a plasma process is completed. That is, the first temperature control involving looking ahead at the temperature setting of the next recipe is not limited to being implemented at the time a process is completed. For example, the timing of the first temperature control may be within a certain time frame in connection with the completion of a process. Alternatively, the timing of the first temperature control may be during a wafer exit process that is executed after completion of a process or during a wafer entry process that is executed after completion of a process. Note, however, that the temperature stabilization wait time becomes longer as the time lapse from completion of a process to the start of the first temperature control is prolonged.

Also, temperature control according to the present embodiment that involves the parallel process of temperature control (temperature stabilization wait process) and a wafer exit process is merely one example of the second temperature control for controlling the temperature to the temperature setting of a next process in parallel with a wafer entry process or a wafer exit process. That is, the start timing of the parallel process of the second temperature control and the wafer entry or exit process is not limited to the time a process is completed. For example, the timing of the second temperature control may be during the wafer entry process or the wafer exit process. That is, one of the above two processes of the parallel process does not necessarily have to be included within the other one of the processes as long as at least portions of the two processes are executed in parallel. Note, however, that as the time lapse from wafer entry/exit to the start of the second temperature control or the time lapse from the start of the second temperature control to wafer entry/exit becomes longer, the parallel processing time becomes shorter and the temperature stabilization wait time becomes longer.

Also, with respect to the temperature setting of the next process to which the temperature is controlled by the temperature control unit 86 in the first and second temperature control, the temperature setting of the wafer exit process prescribed in the currently executed recipe may be arranged to be the same as the temperature setting of the next process. In this way, the temperature control unit 86 may use the temperature setting of the wafer exit process prescribed in the currently executed recipe as the temperature setting of the next process in implementing the first and second temperature control.

Also, by arranging the temperature setting of the wafer entry process prescribed in the next recipe to be the same as the temperature setting of the next process, the temperature control unit 86 may use the temperature setting of the wafer entry process prescribed in the next recipe as the temperature setting of the next process in implementing the first and second temperature control.

Further, instead of implementing temperature control by looking ahead at the temperature setting of the next process prescribed in a recipe, the temperature control unit 86 may implement temperature control by looking ahead at temperature setting parameters for the next process that are set up by an operator, for example.

(Temperature Control Monitoring Function)

Figure 6:
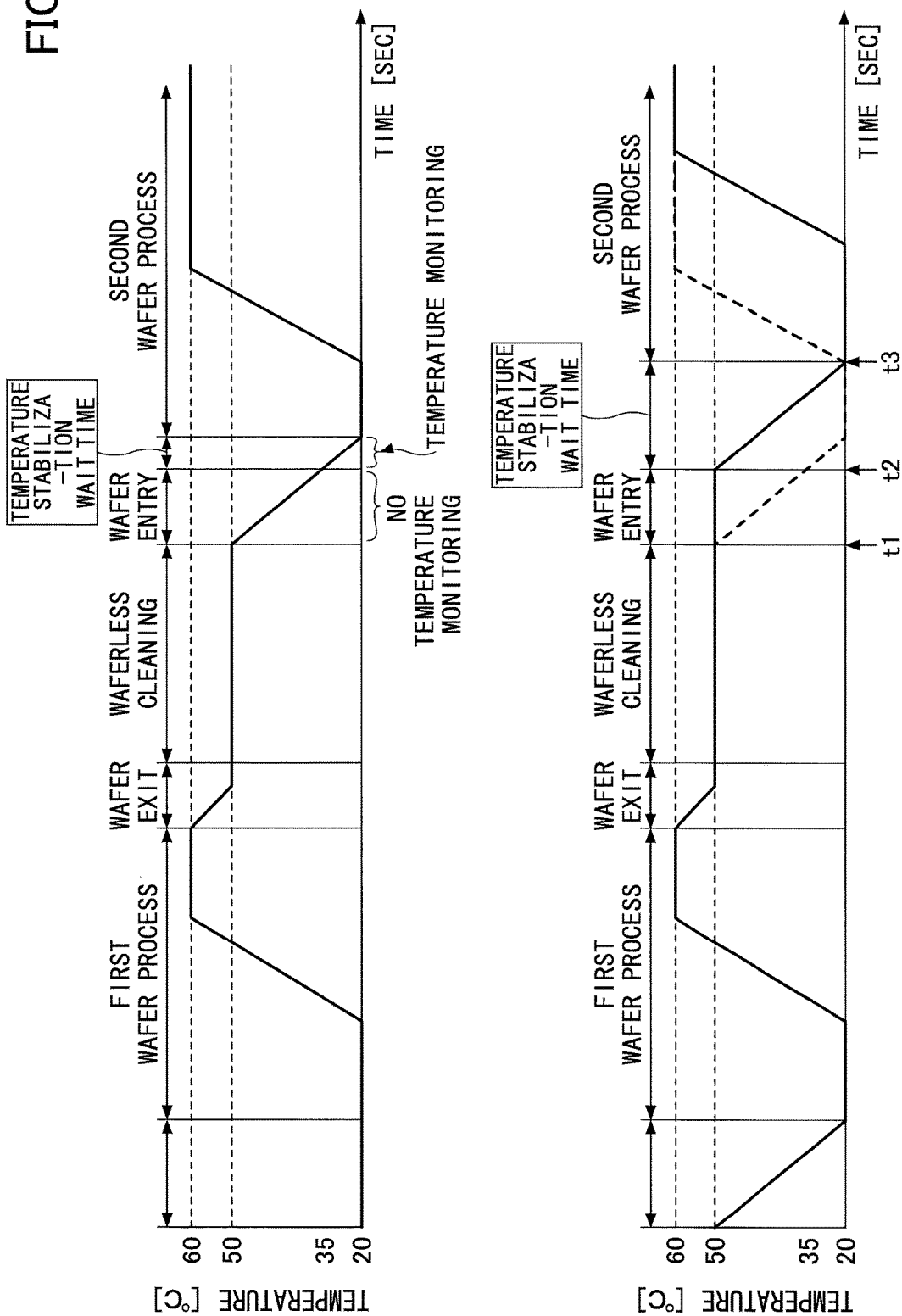
FIG. 6 illustrates a relationship between temperature monitoring and a temperature stabilization wait time according to an embodiment of the present invention.

In the following, a temperature control monitoring function according to an embodiment of the present invention is described with reference to FIG. 6. Note that a solid line in the upper graph of FIG. 6 illustrates a temperature change resulting from implementing temperature control according to the present embodiment, and a solid line in the lower graph of FIG. 6 illustrates a temperature change resulting from implementing the above-described general temperature control. Also, a dashed line in the lower graph of FIG. 6 illustrates the temperature change of the present embodiment to facilitate comparison of temperature stabilization wait times between the general example and the present embodiment.

In the general temperature control operation, before a wafer entry process is started, the temperature of the electrostatic chuck is controlled to the temperature setting during wafer entry and is stabilized. In such a state, the wafer entry process is started (see lower graph of FIG. 6, time t1). After the wafer entry process is completed (time t2), the temperature is controlled to the temperature setting of a next process for processing a second wafer, and after the temperature stabilizes, the next process is started (time t3).

However, when temperature monitoring is performed before wafer entry, the wafer entry process cannot be started until the temperature of the electrostatic chuck is controlled to the temperature setting during wafer entry. Accordingly, as illustrated in the upper graph of FIG. 6, in the temperature control operation according to the present embodiment, temperature monitoring is not performed before and during the wafer entry process. In the present embodiment, temperature monitoring is started after completion of the wafer entry process. In this way, the wafer entry process and temperature control (temperature stabilization wait process) may be executed in parallel. By comparing the upper and lower time charts (graphs) of FIG. 6, it may be appreciated that in the temperature control operation according to the present embodiment, the temperature stabilization wait time may be reduced, the second wafer process may be started earlier, and throughput may be improved compared to the general temperature control operation.

Note that temperature control according to the present embodiment is described above through illustration of an exemplary case of executing an etching process on a first wafer, a cleaning process, and an etching process on a second wafer in this order.

(Other Temperature Control Example)

In contrast, temperature control according to the present embodiment is described below in connection with an exemplary case of executing an etching process on a first wafer and an etching process on a second wafer in this order. Note that the present example similarly applies to a case of executing a process requiring rapid temperature control in a plasma processing apparatus that is capable of changing the temperature setting for each step of a plasma process including multiple steps for processing a wafer.

Figure 7:
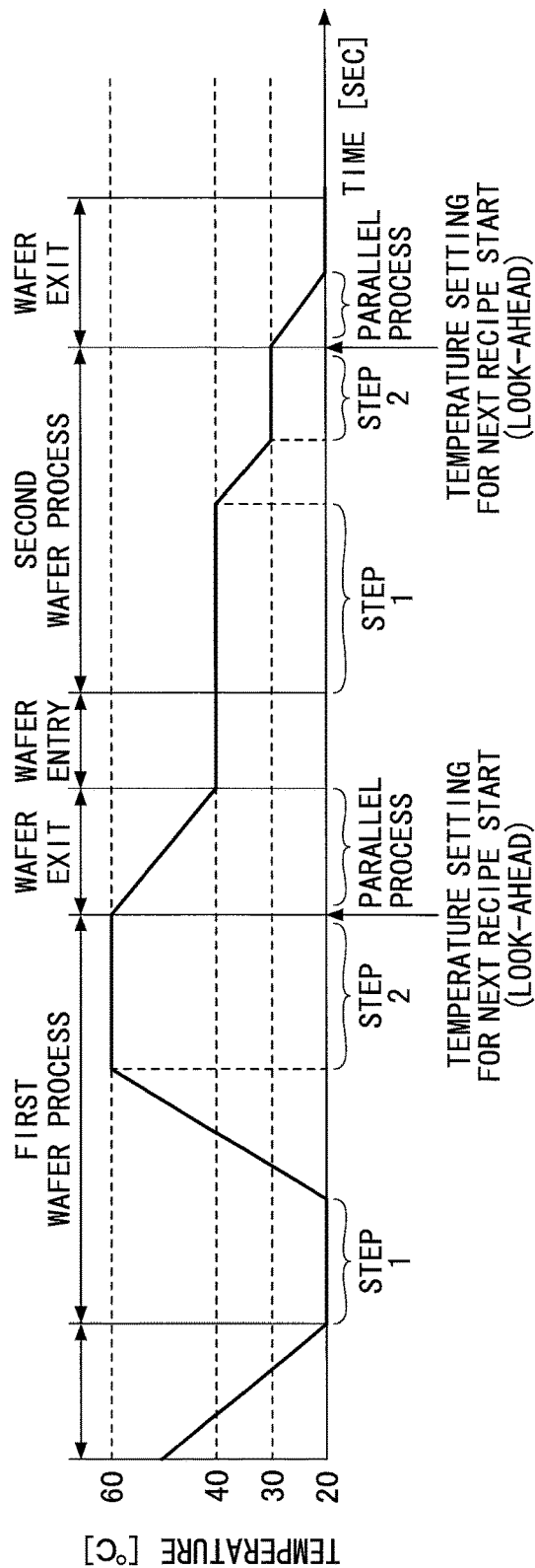
FIG. 7 illustrates another exemplary implementation of temperature control according to an embodiment of the present invention.

FIG. 7 includes a table indicating temperature settings of an etching process recipe 1 for etching a first wafer and an etching process recipe 2 for etching a second wafer in a case where execution of an etching process on the first wafer is immediately followed by execution of an etching process on the second wafer. FIG. 7 also includes a graph illustrating a result of implementing temperature control according to the present embodiment in the case of executing an etching process on the first wafer immediately followed by an etching process on the second wafer. Before the temperature control process is started, the temperature within the processing chamber 10 is controlled to the temperature setting 20° C. during wafer entry prescribed in the process recipe 1 as illustrated in the table of FIG. 7.

First, the transfer control unit 81 starts control of the wafer entry process of the first wafer W. Then, the etching execution unit 83 executes step 1 of the etching process on the first wafer W. While step 1 of the etching process is executed on the first wafer W, the temperature is maintained at 20° C.

After step 1 of the etching process is completed, the temperature control unit 86 controls the temperature to the temperature setting 60° C. of step 2 of the etching process according to the etching process recipe 1 and waits until the temperature within the processing chamber 10 stabilizes to the temperature setting. After the temperature stabilizes, the etching execution unit 83 executes step 2 of the etching process. While step 2 of the etching process is executed, the temperature is maintained at 60° C.

After the etching process on the first wafer W is completed, the temperature control unit 86 changes the temperature setting to that for executing the next process, and the transfer control unit 81 executes a wafer exit process in parallel with such temperature control. Specifically, the temperature control unit 86 controls the temperature by changing the temperature setting to 40° C. corresponding to the temperature setting during wafer exit prescribed in the etching process recipe 1.

In the present example, as illustrated in the graph of FIG. 7, after step 2 of the etching process is completed, the wafer exit process of the first wafer W is performed along with temperature control for changing the temperature setting to 40° C. corresponding to the temperature setting during step 1 prescribed in the etching process recipe 2, and the temperature control is implemented in parallel with the wafer exit process and a wafer entry process until the temperature stabilizes. By looking ahead at the temperature setting of the next recipe and controlling the temperature to the temperature setting of the next process immediately after execution of a process is completed as in the above example, the temperature stabilization wait time may be reduced. Also, the temperature stabilization wait time may be reduced by implementing the above temperature control in parallel with the wafer exit process and/or the wafer entry process. In this way, throughput during wafer manufacturing may be improved, and productivity may be increased.

As described above, temperature control according to the present embodiment may be implemented in a case where there is a difference between a temperature setting of a last step of a plasma process at the time execution of the process is completed and a temperature setting of a first step of the next process. According to an aspect of the present embodiment, the temperature stabilization wait time may be reduced and the throughput during wafer manufacturing may be increased in such a case.

<Concluding Remarks>

Although the present invention has been described above with respect to certain illustrative embodiments, the present invention is not limited to these embodiments. That is, numerous variations and modifications will readily occur to those skilled in the art, and the present invention includes all such variations and modifications that may be made without departing from the scope of the present invention.

For example, temperature control according to an embodiment of the present invention involves implementing at least one of a first temperature control (look ahead temperature control) and a second temperature control (parallel process of temperature control and wafer entry/exit). Note, however, that the temperature stabilization wait time may be reduced further to improve throughput in a case where both the first temperature control and the second temperature control are implemented compared to a case where only one of the first temperature control or the second temperature control is implemented. For example, the first temperature control and the second temperature control are preferably both implemented in a case where there is a difference between the temperature setting of a wafer entry process and the temperature setting of a wafer exit process. In such a case, each time the temperature is controlled to a different temperature setting, a wait time may be imposed until the temperature stabilizes to the temperature setting, and an overall temperature stabilization wait time tends to get longer as a result. Also, the first temperature control and the second temperature control are preferably both implemented in a case where there is a difference between a temperature setting of a cleaning process and a temperature setting of a step of a plasma process.

Also, temperature control according to an embodiment of the present invention is not limited to being implemented in a waferless dry cleaning process or a plasma process for a product wafer, but may be implemented in a dry cleaning process using a wafer or a plasma process using a dummy wafer, for example.

Also, although temperature control according to an embodiment of the present invention is described above in connection with an exemplary case where a temperature setting at the time execution of a wafer process is completed differs from a temperature setting of a next wafer process, implementation of the present invention is not limited to such a case. For example, in a case where the processing chamber is idle, the first temperature control or the second temperature control of the present invention may be implemented in parallel with a wafer entry process for initiating a wafer process on a first wafer from the idle state where no wafer process is performed. Further, in a case where a temperature setting of the processing chamber is controlled and changed on a lot-to-lot basis, the first temperature control or the second temperature control of the present invention may be implemented when a lot subject to processing is switched from one lot to another lot, for example.

Also, a plasma process that may be subject to temperature control according to an embodiment of the present invention is not limited to an etching process, but may include other processes such as film formation, ashing, and sputtering, for example.

Also, a temperature control method according to an embodiment of the present invention is not limited to controlling the temperature of an electrostatic chuck arranged within a plasma processing apparatus, but may also be used to control the temperature of an upper electrode, a deposition shield, or the processing chamber, for example.

Also, the temperature control method of the present invention is not limited to being applied to a parallel-plate type etching apparatus but may also be applied to a cylindrical RLSA (radical line slot antenna) plasma processing apparatus, an ICP (inductively coupled plasma) plasma processing apparatus, a microwave plasma processing apparatus, or some other type of plasma processing apparatus.

The present application is based on and claims the benefit of priority of Japanese Patent Application No. 2011-244539 filed on Nov. 8, 2011, and U.S. Provisional Application No. 61/560,952 filed on Nov. 17, 2011, the entire contents of which are herein incorporated by reference.

DESCRIPTION OF THE REFERENCE NUMERALS 1 plasma processing apparatus
10 processing chamber
12 mounting table (lower electrode)
32 high frequency power supply
38 shower head (upper electrode)
40 electrostatic chuck
62 gas supply source
71 chiller unit
75 heater
80 controller
81 transfer control unit
82 process execution unit
83 etching execution unit
84 cleaning execution unit
85 storage unit
86 temperature control unit

The invention claimed is:

1. A temperature control method for controlling a plasma processing apparatus that performs a plasma process including a plurality of steps on a workpiece and is capable of changing a temperature setting for each step of the plasma process, the temperature control method comprising:
a transfer step of performing at least one of an entry process for transferring the workpiece into a processing chamber of the plasma processing apparatus and an exit process for transferring the workpiece out of the processing chamber;
a process execution step of executing the plasma process including the plurality of steps; and
a temperature control step of performing at least one of a first temperature control and a second temperature control, the first temperature control including controlling a temperature of an electrostatic chuck to a temperature setting of a next process upon completing an execution of a predetermined one of the plurality of steps of the plasma process, and the second temperature control including controlling the temperature of the electrostatic chuck to the temperature setting of the next process while performing at least one of the entry process for transferring the workpiece into the processing chamber of the plasma processing apparatus and the exit process for transferring the workpiece out of the processing chamber,
wherein the method further comprises a reading step of reading ahead the temperature setting of the next process, while performing at least one of the entry process for transferring the workpiece into the processing chamber of the plasma processing apparatus and the exit process for transferring the workpiece out of the processing chamber, upon completing the execution of the predetermined one of the plurality of steps of the plasma process before the temperature control step.

2. The temperature control method as claimed in claim 1, wherein the temperature control step is performed in a case where a temperature setting of a last step of the plasma process at the time the execution of the plasma process is completed is different from a temperature setting of a first step of the next process.

3. The temperature control method as claimed in claim 1, wherein the entry process includes opening a gate valve arranged within the processing chamber, transferring the workpiece that is held by a transfer arm into the processing chamber, arranging a pusher pin to hold the workpiece, and placing the workpiece on a mounting table arranged within the processing chamber.

4. The temperature control method as claimed in claim 1, wherein the exit process includes holding the workpiece with a pusher pin after the execution of the plasma process, arranging a transfer arm to hold the workpiece, and transferring the workpiece out of the processing chamber via a gate valve.

5. The temperature control method as claimed in claim 1, wherein the temperature control step includes performing the first temperature control and the second temperature control in a case where a temperature setting of the entry process differs from a temperature setting of the exit process.

6. The temperature control method as claimed in claim 1, wherein the first temperature control of the temperature control step includes controlling the temperature to the temperature setting of the next process at the time the execution of the plasma process is completed.

7. The temperature control method as claimed in claim 1, wherein the second temperature control of the temperature control step includes controlling the temperature to the temperature setting of the next process at the time the entry process or the exit process is performed.

8. The temperature control method as claimed in claim 6, wherein the temperature control step is performed in a case where the temperature setting of the next process is higher than a temperature setting of at least one step of the plurality of steps included in the plasma process.

9. The temperature control method as claimed in claim 1, wherein the temperature control step includes refraining from performing temperature monitoring before the transfer step and during the transfer step, and starting temperature monitoring after the transfer step.

10. A control apparatus used in a plasma processing apparatus that performs a plasma process including a plurality of steps on a workpiece and is capable of changing a temperature setting for each step of the plasma process, the control apparatus comprising:
a transfer control unit that performs at least one of an entry process for transferring the workpiece into a processing chamber of the plasma processing apparatus and an exit process for transferring the workpiece out of the processing chamber;

a process execution unit that executes the plasma process including the plurality of steps; and a temperature control unit that performs at least one of a first temperature control and a second temperature control, the first temperature control including controlling a temperature of an electrostatic chuck to a temperature setting of a next process upon completing an execution of a predetermined one of the plurality of steps of the plasma process, and the second temperature control including controlling the temperature of the electrostatic chuck to the temperature setting of the next process while performing at least one of the entry process for transferring the workpiece into the processing chamber of the plasma processing apparatus and the exit process for transferring the workpiece out of the processing chamber, wherein the temperature control unit further reads ahead the temperature setting of the next process, while performing at least one of the entry process for transferring the workpiece into the processing chamber of the plasma processing apparatus and the exit process for transferring the workpiece out of the processing chamber, upon completing the execution of the predetermined one of the plurality of steps of the plasma process before said at least one of the first temperature control and the second temperature control.

11. A plasma processing apparatus comprising:
a processing chamber;
a gas supply source that supplies gas to the processing chamber;
a plasma source that supplies power for plasma generation to the processing chamber and generates plasma from gas within the processing chamber;
a temperature control unit that controls a temperature of at least one of a mounting table in the processing chamber, an upper electrode in the processing chamber, a deposition shield in the processing chamber, and the processing chamber;
a transfer control unit that performs at least one of an entry process for transferring a workpiece into the processing chamber and an exit process for transferring the workpiece out of the processing chamber; and a process execution unit that executes a plasma process including a plurality of steps using the generated plasma;

wherein the temperature control unit performs at least one of a first temperature control and a second temperature control, the first temperature control including controlling a temperature of an electrostatic chuck to a temperature setting of a next process upon completing an execution of a predetermined one of the plurality of steps of the plasma process, and the second temperature control including controlling the temperature of the electrostatic chuck to the temperature setting of the next process while performing at least one of the entry process for transferring the workpiece into the processing chamber of the plasma processing apparatus and the exit process for transferring the workpiece out of the processing chamber, wherein the temperature control unit further reads ahead the temperature setting of the next process, while performing at least one of the entry process for transferring the workpiece into the processing chamber of the plasma processing apparatus and the exit process for transferring the workpiece out of the processing chamber, upon completing the execution of the predetermined one of the plurality of steps of the plasma process before said at least one of the first temperature control and the second temperature control.

12. The temperature control method as claimed in claim 1, wherein the next process is to be performed in the process chamber subsequent to the execution of the plasma process.

13. The temperature control method as claimed in claim 1, wherein the next process includes a waferless dry cleaning process.

14. The temperature control method as claimed in claim 1, wherein the reading step of reading ahead the temperature setting of the next process is performed by reading ahead a temperature setting parameter of the temperature for the next process that is set by an operator.

* * * * *